United States Patent [19]

Kajiyama et al.

[11] Patent Number: 4,677,437

[45] Date of Patent: Jun. 30, 1987

[54] INPUT SIGNAL SWITCHING MATRIX FOR AN ELEVATOR

[75] Inventors: Ryuichi Kajiyama, Inazawa; Ryoji Takahashi, Ichinomiya, both of Japan

[73] Assignee: Mitsubishi Denki Kabushiki Kaisha, Tokyo, Japan

[21] Appl. No.: 850,080

[22] Filed: Apr. 9, 1983

Related U.S. Application Data

[63] Continuation of Ser. No. 530,477, Sep. 8, 1983, abandoned.

[30] Foreign Application Priority Data

Sep. 21, 1982 [JP] Japan ..................................... 164308

[51] Int. Cl.⁴ ............................................. H04Q 1/00
[52] U.S. Cl. .......................... 340/825.79; 340/825.82; 340/825.83; 187/100
[58] Field of Search ...................... 340/825.79, 825.82, 340/825.83, 825.9, 365 K, 365 S; 361/42, 93, 98, 100; 187/29 R; 330/127; 235/311; 307/125, 126, 130, 131

[56] References Cited

U.S. PATENT DOCUMENTS

| | | | |
|---|---|---|---|
| 4,335,374 | 6/1982 | Nyuji | 340/365 S |
| 4,412,218 | 10/1983 | Niitsu | 340/365 S |
| 4,518,951 | 5/1985 | Backes | 340/365 S |

Primary Examiner—Ulysses Weldon
Attorney, Agent, or Firm—Leydig, Voit & Mayer

[57] ABSTRACT

In this invention, "column" buses connected to a power supply and "row" input lines are arranged in the shape of a matrix, external signal lines are connected to the intersection points thereof, and the "column" buses are switched at predetermined cycles by the signals of a sequence circuit so as to sequentially apply the signals of the external signal lines from the "row" input lines to signal inputting circuits, and when any of the "column" buses, "row" input lines and external signal lines has grounded, the operation of the sequence circuit is ceased during the grounding. Accordingly, the apparatus can sharply reduce the number of signal lines, and it can eliminate the labor of maintenance owing to a reliability higher than that of an apparatus employing a fuse.

1 Claim, 5 Drawing Figures

INPUT SIGNAL SWITCHING MATRIX FOR AN ELEVATOR

This application is a continuation of application Ser. No. 530,477, filed Sept. 8, 1983 now abandoned.

BACKGROUND OF THE INVENTION

This invention relates to improvements in an apparatus for applying the control signals of an elevator as inputs.

In an elevator, a large number of control signals are exchanged between a machinery room and a car. A signal inputting apparatus is as shown in FIG. 1.

Referring to the figure, numeral 1 designates a power supply bus. External signal elements, such as relay contacts or switches, 21-2n are connected to the power supply bus and generate the control signals of the elevator. Signal inputting circuits 31-3n are respectively connected to the external signal elements 21-2n and comprise respective protective resistors 41-4n and photocouplers (each consisting of a light emitting diode and a phototransistor) 51-5n. Terminals 61-6n are respectively connected to the output sides of the signal inputting circuits 31-3n and transmit signals to an elevator control device (not shown).

For example, when the external signal element 21 is open, the photocoupler 51 does not turn "on", and a voltage at a level which is determined by the voltage of the power supply bus 1 appears at the terminal 61. On the other hand, when the external signal element 21 is closed, the photocoupler 51 turns "on", and the voltage of the terminal 61 becomes null. Thus, the signal is transmitted to the elevator control device.

In this case, supposing that the external signal elements 21-2n are installed in the car and that the remaining parts are installed in the machinery room, wiring leads connecting the power supply bus 1 and the external signal elements 21-2n must be provided as wires in a moving cable between the machinery room and the car. Therefore, as the number of the external signal elements 21-2n increases, the number of the wires in the moving cable also increases to render the apparatus expensive. Other problems are that, the increase in the number of the wires in the moving cable also complicates the installation work thereof, and also increases the weight of the moving cable which requires an increased capacity of a hoist.

Moreover, when a part of the circuitry is shorted, a fuse (not shown) connected to the power supply bus 1 blows out. The fuse must be replaced each time, which is troublesome.

SUMMARY OF THE INVENTION

This invention eliminates the drawbacks mentioned above, and has for its object to provide a signal inputting apparatus for an elevator in which power supply buses and input lines are arranged in a matrix, external signal lines being connected to the intersection points thereof, and when a ground occurs in the circuit, operation is ceased during the grounding, thereby to sharply reduce the number of signal lines and to dispense with the necessity to change a fuse after recovery from the grounding.

In an embodiment of this invention for accomplishing the object, "column" buses connected to a power supply and "row" input lines are arranged in the shape of a matrix, external signal lines are connected to the intersection points thereof, and the "column" buses are switched at predetermined cycles by the signals of a sequence circuit so as to sequentially apply the signals of the external signal lines from the "row" input lines to signal inputting circuits, and when any of the "column" buses, "row" input lines and external signal lines has grounded, the operation of the sequence circuits is ceased during the grounding. Accordingly, the apparatus can sharply reduce the number of signal lines, and it can eliminate the labor of maintenance owing to a reliability higher than that of an apparatus employing a fuse.

DESCRIPTION OF THE PREFERRED EMBODIMENT

Now, an embodiment of this invention will be described with reference to FIGS. 2 to 5.

Figure 1:
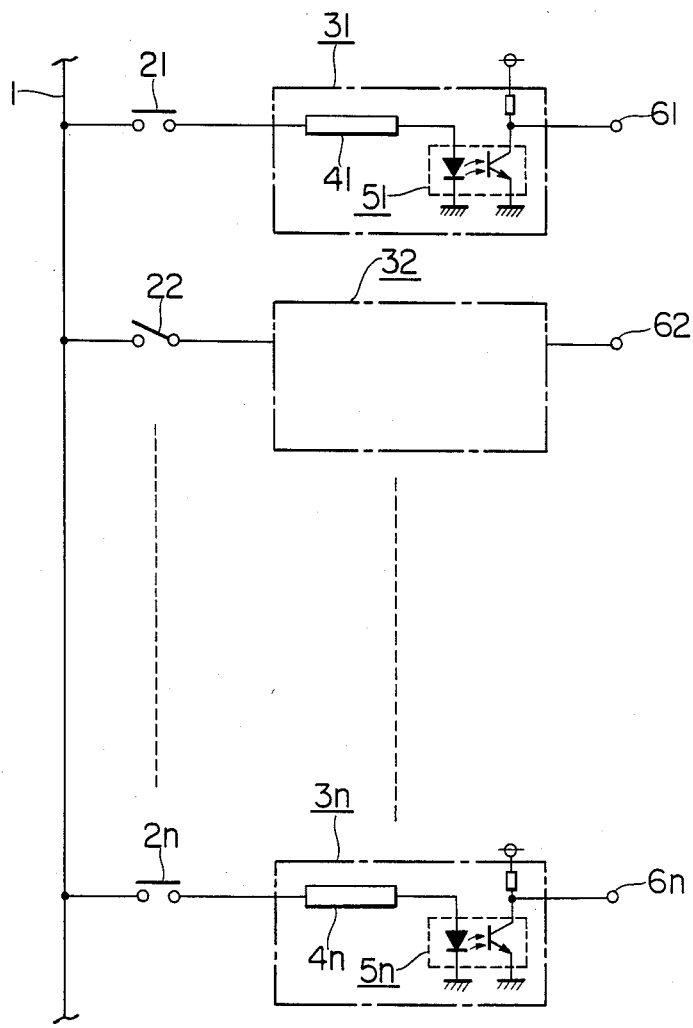
FIG. 1 is a circuit diagram showing a prior-art signal inputting apparatus for an elevator.
Figure 2:
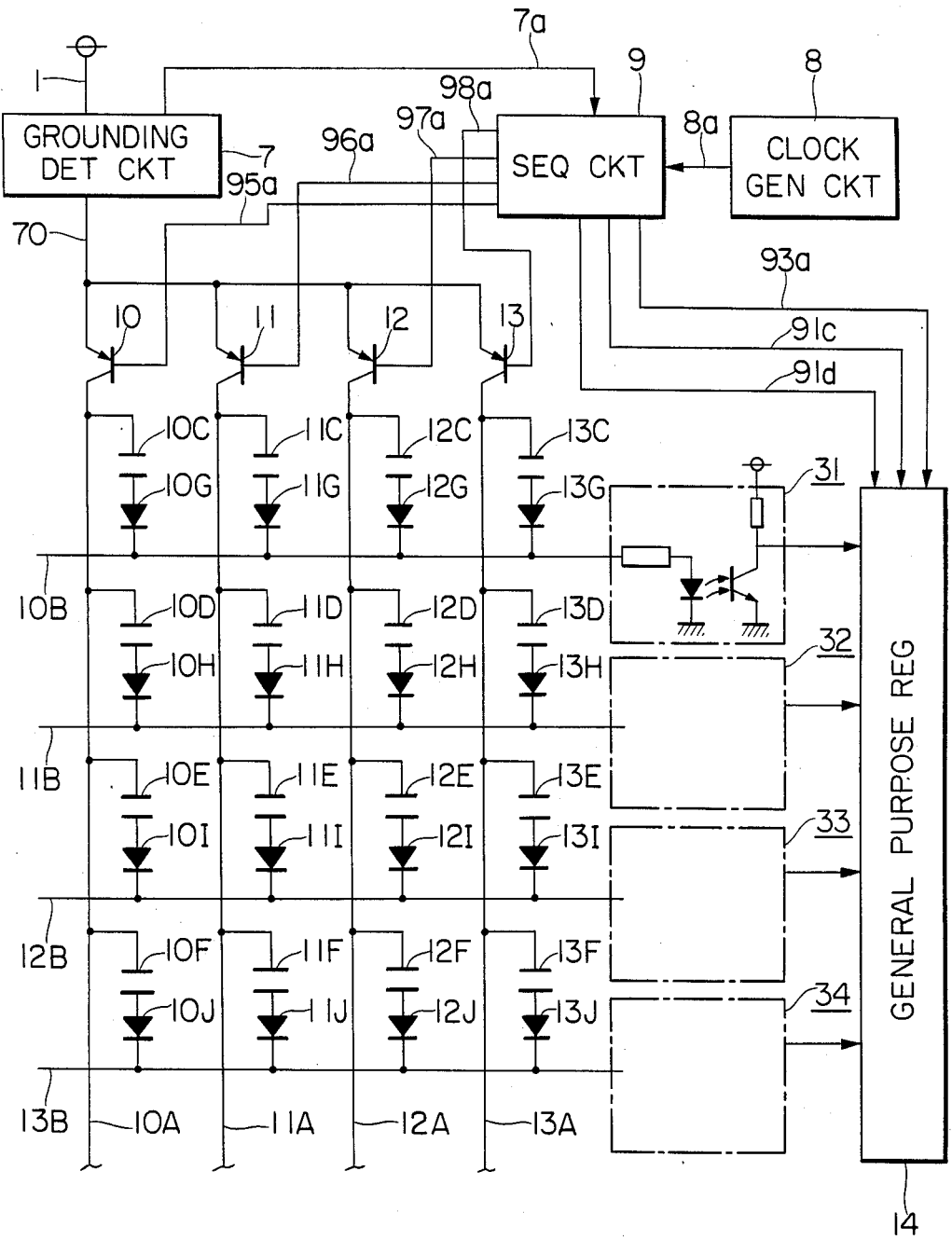
FIG. 2 is a circuit diagram showing an embodiment of a signal inputting apparatus for an elevator according to this invention.

In FIG. 2, numeral 7 designates a grounding detector circuit (shown in detail in FIG. 3) which is connected to a power supply bus 70 and which provides a grounding detection signal 7a. A clock generator circuit 8 generates a pulse 8a every predetermined cycle. A sequence circuit (shown in detail in FIG. 4) 9 is driven by the pulse 8a. Symbols 10A-13A denote "column" buses which are respectively connected to the collectors of transistors 10-13, while symbols 10B-13B denote "row" input lines which are arranged so as to form a matrix with the "column" buses 10A-13A and which are respectively connected to signal inputting circuits 31-34. Symbols 10C-10F, 11C-11F, 12C-12F and 13C-13F indicate external signal elements similar to those 21-2n in FIG. 1, while symbols 10G-10J, 11G-11J, 12G-12J and 13G-13J indicate diodes for blocking reverse currents. Shown at numeral 14 is a well-known general-purpose register which receives and stores the external signal data of the respective "column" buses 10A-13A through the "row" input lines 10B-13B sequentially in time division in accordance with the outputs 91c, 91d and 93a of the sequence circuit 9. The external signal elements and the corresponding diodes (for example, the element 10C and the diode 10G) are connected in series with each other, and the series connections are arranged and connected at the intersection points between the "column" buses 10A-13A and the respective "row" input lines 10B-13B, to form external signal lines.

The transistor 10-13 have their emitters connected to the power supply bus 70, and receive sequence signals 95a-98a at their respective bases. The signal inputting circuits 31-34 are disposed in correspondence with the respective input lines 10B-13B.

Figure 3:
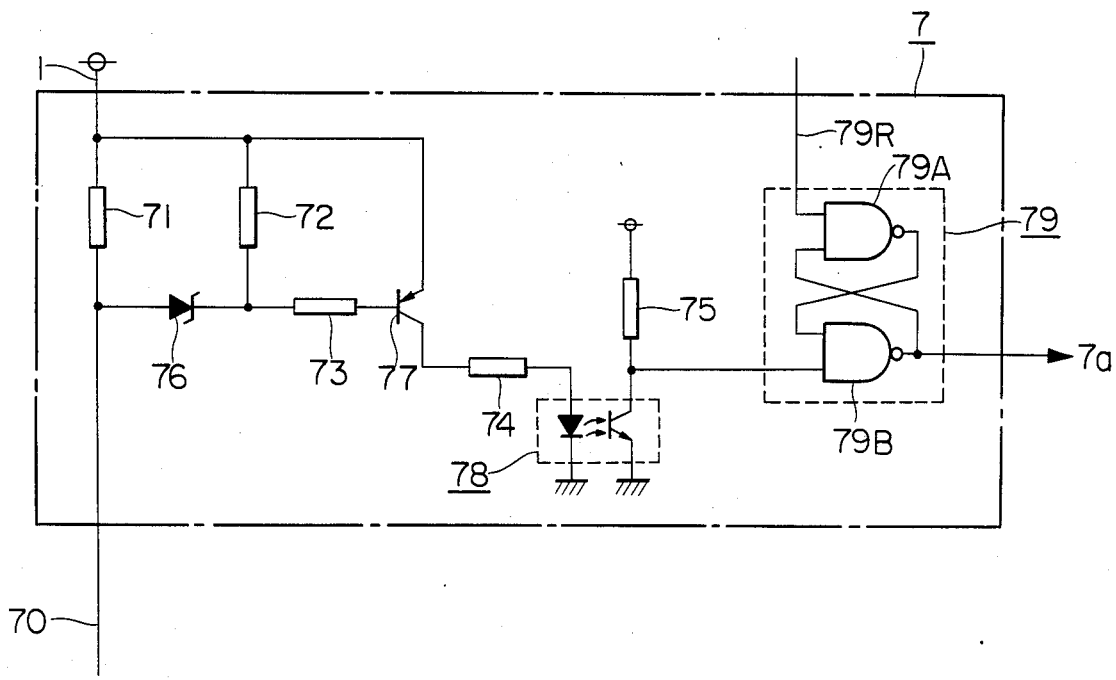
FIG. 3 is a circuit diagram of a grounding detector circuit in FIG. 2.

Referring to FIG. 3, numerals 71-75 indicate current limiting resistors. Numeral 76 indicates a Zener diode, numeral 77 a transistor, and numeral 78 a photocoupler similar to the photocoupler 51 in FIG. 1. Shown at numeral 79 is a well-known flip-flop which consists of NAND gates 79A and 79B and whose reset signal 79R becomes "L" (low level) upon closure of the power supply.

Figure 4:
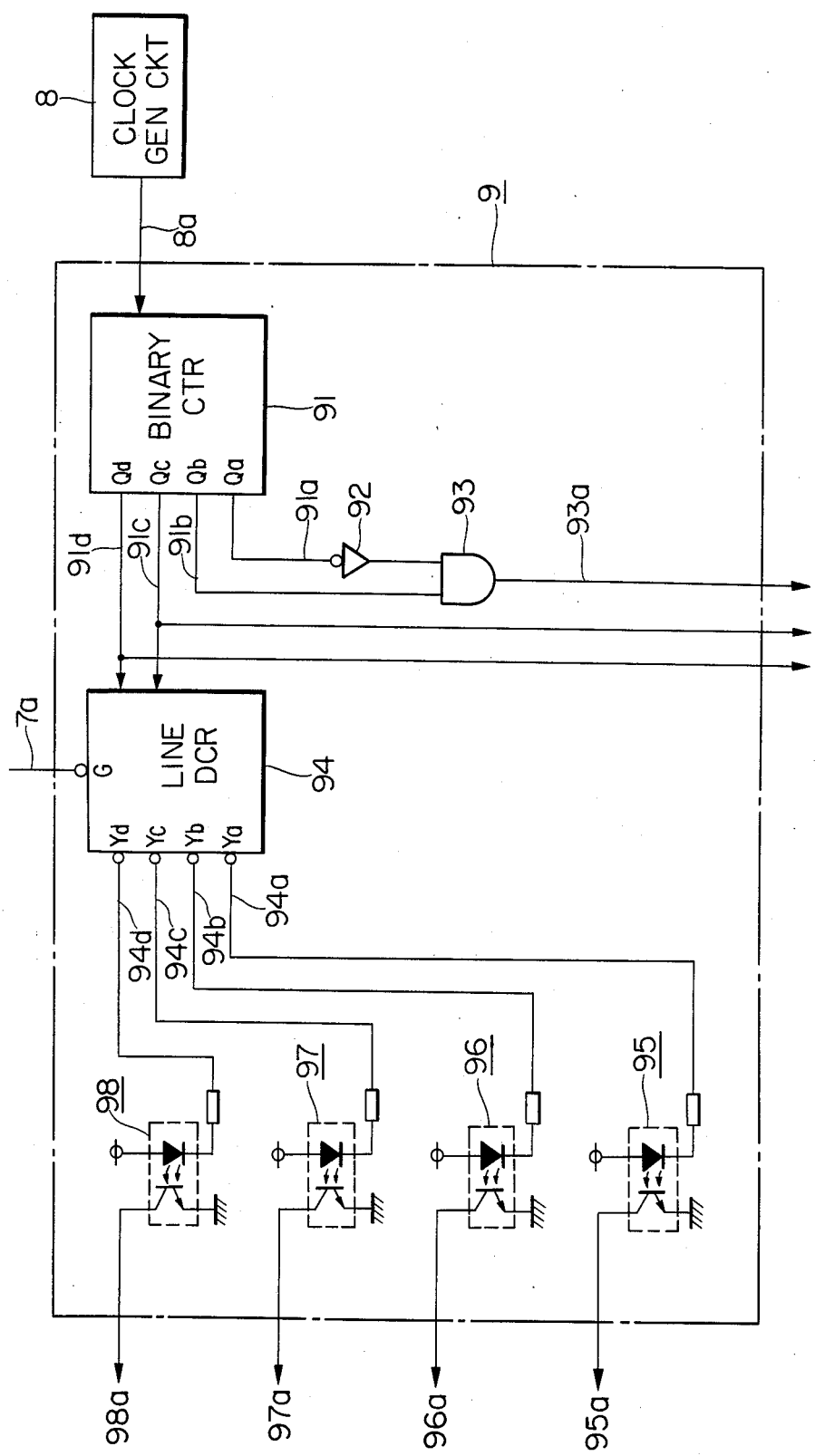
FIG. 4 is a circuit block diagram of a sequence circuit in FIG. 2.
Figure 5:
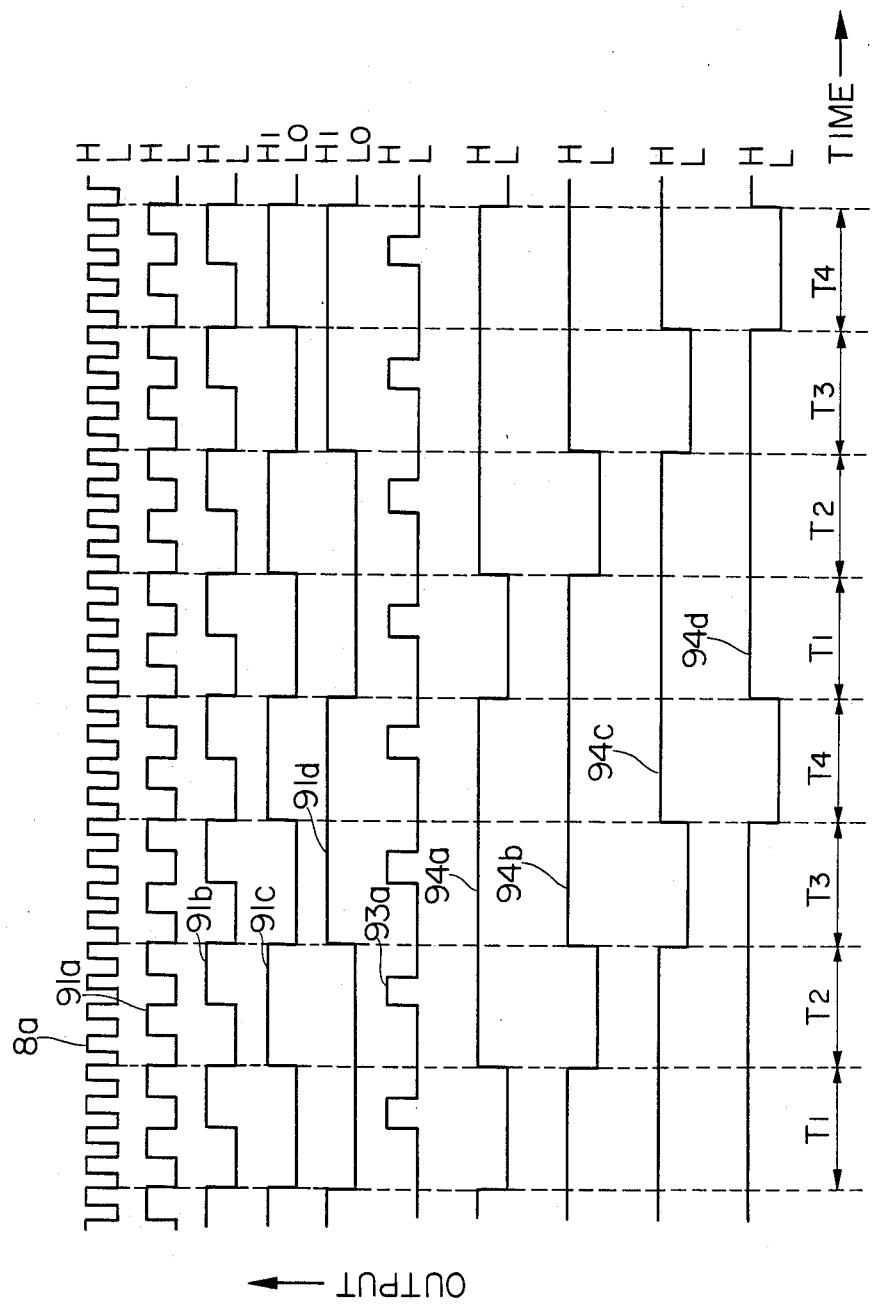
FIG. 5 is a waveform diagram of signals at various parts in FIGS. 2 and 4.

Referring to FIG. 4, numeral 91 designates a well-known 4-bit binary counter which provides signals $91a$–$91d$ as shown in FIG. 5 from its terminals $Q_a$–$Q_d$, respectively. Numeral 92 denotes a NOT gate, and numeral 93 and AND gate which delivers an output $93a$. Shown at numeral 94 is a well-known line decoder which provides signals $94a$–$94d$ as shown in FIG. 5 from its respective terminals $Y_a$–$Y_d$ in dependence on the statuses of the inputs $91c$ and $91d$ when the input of its terminal G is "L" and all the signals $94a$–$94d$ of which become "H" (high level) when the input of the terminal G becomes "H". Numerals 95–98 designate photocouplers each of which is similar to the photocoupler 51 in FIG. 1, and which deliver the respective sequence signals $95a$–$98a$.

Next, the operations of this embodiment will be explained.

Upon the closure of the power supply, the reset signal 79R becomes "L", and the grounding detection signal $7a$ also becomes "L", so that the line decoder 94 is in its operating status.

When the pulses $8a$ are produced from the clock generator circuit 8, they are counted by the binary counter 91, and the signals $91a$–$91d$ are delivered. The signals $91c$, $91d$ are applied to the line decoder 94, and the signals $94a$–$94d$ become "L" in succession in dependence on the statuses "H" and "L" of the signals $91c$, $91d$ as listed in the following table, whereby the photocouplers 95–98 are successively turned "on" to render the sequence signals $95a$–$98a$ "L" in succession.

| Signals of Counter 91 | | Signals of Line Decoder 94 | | | | Sequence signals | | | |
|---|---|---|---|---|---|---|---|---|---|
| 91d | 91c | 94a | 94b | 94c | 94d | 95a | 96a | 97a | 98a |
| L | L | L | H | H | H | L | H | H | H |
| L | H | H | L | H | H | H | L | H | H |
| H | L | H | H | L | H | H | H | L | H |
| H | H | H | H | H | L | H | H | H | L |

When the sequence signals $95a$–$98a$ become "L" in succession, the transistors 10–13 are successively turned "on", and the "column" buses 10A–13A are successively connected to the power supply bus 70. When the external signal element 10C is closed with the "column" bus 10A connected to the power supply bus 70, a circuit composed of the parts 70-10-10C-10G-10B-31-14 is formed, a voltage level is converted by the signal inputting circuit 31, and information on the closure of the element 10C is written into the general-purpose register 14. When the external signal element 10C is opened, the status is similarly written into the general-purpose register 14. In such manner, the statuses of the external signal elements 10C–10F are respectively written into the general-purpose resister 14 via the "row" input lines 10B–13B. Likewise, when the "column" bus 11A is connected with the power supply bus 70, the statuses of the external signal elements 11C–11F are written. When the "column" buses 12A and 13A are connected with the power supply bus 70, the statuses of the external signal elements 12C–12F and 13C–13F are written, respectively.

The operations of writing into the general-purpose register 14 are effected by the signals $91c$, $91d$ and $93a$ from the sequence circuit 9 synchronized with the sequence signals $95a$–$98a$. More specifically, when the signal $91a$ is "L", the output of the NOT gate 92 becomes "H", and subject to the signal $91b$ being "H", the output $93a$ of the AND gate becomes "H", which serves as the write instruction of the general-purpose register 14. Meanwhile, the signals $91c$ and $91d$ are applied to the address select terminals (not shown) of the general-purpose register 14. Therefore, when the sequence signal $95a$ is "L", that is, when the transistor 10 is "on", the contents of the external signal elements 10C–10F are written into the address "OO" of the general-purpose register 14, with one data consisting of 4 bits (time section $T_1$ in FIG. 5). Likewise, when the sequence signal $96a$ is "L" and the transistor 11 is "on", the contents of the external signal elements 11C–11F are written into the address "O1" (time section $T_2$). In the same manner, the contents of the external signal elements 12C–12F are written into the address "10" (time section $T_3$), and the contents of the external signal elements 13C–13F are written into the address "11" (time section $T_4$).

In this way, the statuses of the sixteen external signal elements 10C–10F, ... and 13C–13F, the writing of which requires $16+1=17$ signal lines with the prior art, can be written by the use of the four "column" buses 10A–13A and the "row" input lines 10B–13B, totaling eight lines with the embodiment described in this invention.

Assuming now that the power supply bus 70 is grounded, current greater than a normal value flows through the resistor 71 of the grounding detector circuit 7, and hence, a voltage across the resistor 71 increases. When this voltage exceeds the Zener voltage of the Zener diode 76, the transistor 77 is turned "on", and the photocoupler 78 is turned "on". Thus, the input to the flip-flop 79 becomes "L", so that the grounding detection signal $7a$ is inverted from "L" to "H". Accordingly, all the signals $94a$–$94d$ from the line decoder 94 of the sequence circuit 9 become "H". Thus, all the photocouplers 95–98 are turned "off" to bring the sequence signals $95a$–$98a$ to "H", so that all the transistors 10–13 are turned "off". Therefore, the stored data of the general-purpose register 14 become contents equivalent to those in the case where all the external signal elements 10C–10F, ... and 13C–13F are open.

When the grounded place section of the circuit is restored to normal, the grounding detection signal $7a$ becomes "L" again, so that the line decoder 94 returns into the operating status, and all the circuits return to normal. Any labor such as the exchange of a fuse is thereby made unnecessary.

What is claimed is:

1. An input signal switching matrix
    switching means actuable to connect said buses in parallel to a power supply for energizing said buses;
    a clock generator circuit for generating clock pulses in repetitive cycles;
    sequence circuit means receiving clock pulses from said generator circuit and including a digital circuit operating in one state supplying sequence signals based on clock pulses to actuate said switching means to energize said buses in sequence in successive time periods and shiftable to a second state cutting off the supply of sequence signals to actuate said switching means;

externally actuated means at respective intersections of said buses and said input lines, each having a first status connecting one of said buses to produce a first status representing signal on an intersecting input line when actuated when said one of said buses is energized and a second status represented by a second status representing signal on an intersecting input line when not actuated when said one of said buses in energized;

signal register means for storing signals for operating said elevator;

signal inputting circuits connected, respectively, in said input lines providing a signal inputting circuit in each input line for receiving first and second status representing signals representing the respective status of externally actuated means at all bus intersections with each input line in sequence;

means connecting the sequence signals from said sequence circuit means to control the writing of the first and second status representing signals from each of said signal inputting circuits in said signal register means in sequence in accordance with said sequence signals from said sequence circuit means to provide signals in said signal register means representing the status of all the externally actuated means at all the bus intersections with all the input lines by status representing signals received on the input lines during the successive time periods that the buses are energized;

ground detector circuit means connected between the power supply and said buses including sensing elements producing a two-state control signal having one state responsive to an increase in current flow through said detector circuit means upon the occurrence of a ground condition of any of said buses, said input lines, or said output lines, and means connecting the control signal of said detector means circuit to shift said digital circuit of said sequence circuit means to the second state upon the occurrence of the ground condition to cut off the supply of sequence signals to said switching means.

* * * * *

UNITED STATES PATENT AND TRADEMARK OFFICE
CERTIFICATE OF CORRECTION

PATENT NO. : 4,677,437

DATED : June 30, 1987

INVENTOR(S) : Kajiyama et al

It is certified that error appears in the above-identified patent and that said Letters Patent is hereby corrected as shown below:   Title page:

[22] Filed: Apr. 9, 1986

Signed and Sealed this

Nineteenth Day of April, 1988

Attest:

DONALD J. QUIGG

Attesting Officer     Commissioner of Patents and Trademarks